United States Patent
Yun et al.

(10) Patent No.: US 12,195,279 B2
(45) Date of Patent: Jan. 14, 2025

(54) TRANSPORT VEHICLE AND TRANSPORT SYSTEM COMPRISING THE SAME

(71) Applicant: SEMES CO., LTD., Chungcheongnam-do (KR)

(72) Inventors: Dong Won Yun, Gyeonggi-do (KR); Doo Bong Kim, Daegu (KR); Su Ung Lee, Gyeongsangnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 142 days.

(21) Appl. No.: 17/978,966

(22) Filed: Nov. 2, 2022

(65) Prior Publication Data
US 2023/0183012 A1    Jun. 15, 2023

(30) Foreign Application Priority Data
Dec. 9, 2021    (KR) .................. 10-2021-0176055

(51) Int. Cl.
   *B65G 17/12*    (2006.01)
(52) U.S. Cl.
   CPC .................... *B65G 17/12* (2013.01)
(58) Field of Classification Search
   None
   See application file for complete search history.

(56) References Cited

U.S. PATENT DOCUMENTS

2015/0083549 A1 * 3/2015 Ram ................ B07C 5/36
                                                    198/358

FOREIGN PATENT DOCUMENTS

| JP | 8-119099 | | 5/1996 |
|---|---|---|---|
| JP | 08119099 | A * | 5/1996 |
| JP | 9-132323 | | 5/1997 |
| JP | 10-265006 | | 10/1998 |
| JP | 11-225402 | | 8/1999 |
| JP | 2002-321810 | | 11/2002 |
| KR | 10-2010-0095371 | | 8/2010 |
| KR | 10-1189304 | | 10/2012 |
| KR | 10-2013-0024001 | | 3/2013 |

(Continued)

OTHER PUBLICATIONS

Notice of Allowance dated Sep. 19, 2023 for Korean Patent Application No. 10-2021-0176055 and its English machine translation by Google Translate.

(Continued)

*Primary Examiner* — Kavel Singh
(74) *Attorney, Agent, or Firm* — WOMBLE BOND DICKINSON (US) LLP (57) ABSTRACT

Provided is a transport system to facilitate interlayer movement of a transported object. The transport system comprises: a rail device; and a transport vehicle moving in the rail device, wherein the rail device comprises: a first rail with a first inclination angle; a second rail with a second inclination angle larger than the first inclination angle; a first connection rail configured to connect the first rail to the second rail; and a rack rail installed along the first connection rail and the second rail, wherein the transport vehicle comprises: a frame; a driving wheel connected to the frame and moving the first rail, the first connection rail and the second rail; and a pinion gear connected to the frame and moving along the rack rail.

19 Claims, 10 Drawing Sheets

(56) References Cited

FOREIGN PATENT DOCUMENTS

KR         10-1833310       2/2018
KR   10-2021-0137262    11/2021

OTHER PUBLICATIONS

Office Action dated Dec. 5, 2023 for Japanese Patent Application No. 2022-194006 and its English machine translation by Google Translate.

* cited by examiner

TRANSPORT VEHICLE AND TRANSPORT SYSTEM COMPRISING THE SAME

CROSS-REFERENCE TO RELATED APPLICATION

This application claims priority from Korean Patent Application No. 10-2021-0176055 filed on Dec. 9, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a transport vehicle and a transport system comprising the same.

2. Description of the Related Art

In a semiconductor factory, transported objects (e.g., a front opening universal pod (FOUP) and a front opening shipping box (FOSB)) are moved by an automatic transport system. Such an automatic transport system includes, for example, an overhead hoist transport (OHT) and an overhead shuttle (OHS).

SUMMARY

Meanwhile, in order to move a transported object between layers, a tower lifter is used. However, since the transported object has to be moved from a transport vehicle such as the OHT to the tower lifter, there is some waiting time before loading the transported object to the tower lifter. Therefore, numerous transported objects are concentrated in the tower lifter area.

Aspects of the present disclosure provide a transport system to facilitate interlayer movement of a transported object.

Aspects of the present disclosure also provide a transport vehicle used in the transport system.

The technical aspects of the present disclosure are not restricted to those set forth herein, and other unmentioned technical aspects will be clearly understood by one of ordinary skill in the art to which the present disclosure pertains by referencing the detailed description of the present disclosure given below.

Technical Solution

According to an aspect of the present disclosure, there is provided a transport system comprising: a rail device; and a transport vehicle moving in the rail device, wherein the rail device comprises: a first rail with a first inclination angle; a second rail with a second inclination angle larger than the first inclination angle; a first connection rail configured to connect the first rail to the second rail; and a rack rail installed along the first connection rail and the second rail, wherein the transport vehicle comprises: a frame; a driving wheel connected to the frame and moving the first rail, the first connection rail and the second rail; and a pinion gear connected to the frame and moving along the rack rail.

According to another aspect of the present disclosure, there is provided a transport system comprising: a rail device comprising a first rail extending horizontally, a first connection rail connected to the first rail and configured to increase an inclination angle thereof; a second rail connected to the first rail and extending vertically; a second connection rail connected to the second rail and configured to decrease an inclination angle thereof, and a third rail connected to the second connection rail and extending horizontally; and a transport vehicle moving along a side surface of the first rail, a side surface of the first connection rail, a side surface of the second rail, a side surface of the second connection rail, and a side surface of the third rail. The rail device further comprises a rack rail installed on the first connection rail, the second rail and the second connection rail, and not installed on the first rail and the third rail, and the transport vehicle comprises a driving wheel and a pinion gear. When the transport vehicle moves on the first rail, the driving wheel is used. When the transport vehicle moves up along the first connection rail, the second rail and the second connection rail, the driving wheel and the pinion gear are used. When the transport vehicle moves on the third rail, the driving wheel is used.

According to an aspect of the present disclosure, there is also provided a transport vehicle comprising: a frame including an outer surface, an inner surface, an upper surface and a lower surface; a hand unit installed on the outer surface of the frame and configured to support the transported object; a cross roller bearing connected to the hand unit and configured to maintain the horizontality of the hand unit; a pickup unit installed on the inner surface of the frame and configured to receive power from the rail device; a first subframe protruding towards the rail device on the upper surface of the frame; a first guide wheel installed on a lower surface of the first subframe; a second subframe protruding towards the rail device on the lower surface of the frame; a second guide wheel installed on an upper surface of the second subframe; and a driving wheel and a pinion gear installed in the second subframe.

Specific details of other embodiments are included in the detailed description and the drawings.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Hereinafter, embodiments of the present disclosure will be described with reference to the attached drawings. The merits and characteristics of the present disclosure and a method for achieving the merits and characteristics will become more apparent from the embodiments described in detail in conjunction with the accompanying drawings. However, the present disclosure is not limited to the disclosed embodiments, but may be implemented in various different ways. The embodiments are provided to only complete the disclosure of the present disclosure and to allow those skilled in the art to understand the category of the present disclosure. The present disclosure is defined by the category of the claims. Like numbers refer to like elements throughout the description of the figures.

The spatially relative terms "below", "beneath", "lower", "above", "upper" may be used to easily describe the correlation of a device or components with other devices or components. Spatially relative terms are to be understood as including terms in different directions of the device in use or operation in addition to the directions shown in the figures. For example, when flipping a device shown in the figure, a device described as "below" or "beneath" of another device may be placed "above" of another device. Thus, the exemplary term "below" can encompass both an orientation of above and below. The device can also be oriented in other directions, so that spatially relative terms can be interpreted according to orientation.

Although the first, second, etc. are used to describe various elements, components and/or sections, these elements, components and/or sections are of course not limited by these terms. These terms are only used to distinguish one element, component or section from another element, component or section. Therefore, the first device, the first component, or the first section mentioned below may be a second device, a second component, or a second section within the technical spirit of the present disclosure.

Hereinafter, preferred embodiments according to the present disclosure are described in detail with reference to the accompanying drawings. The same or similar elements are assigned the same reference numerals irrespective of their reference numerals, and a redundant description thereof is omitted.

Figure 1:
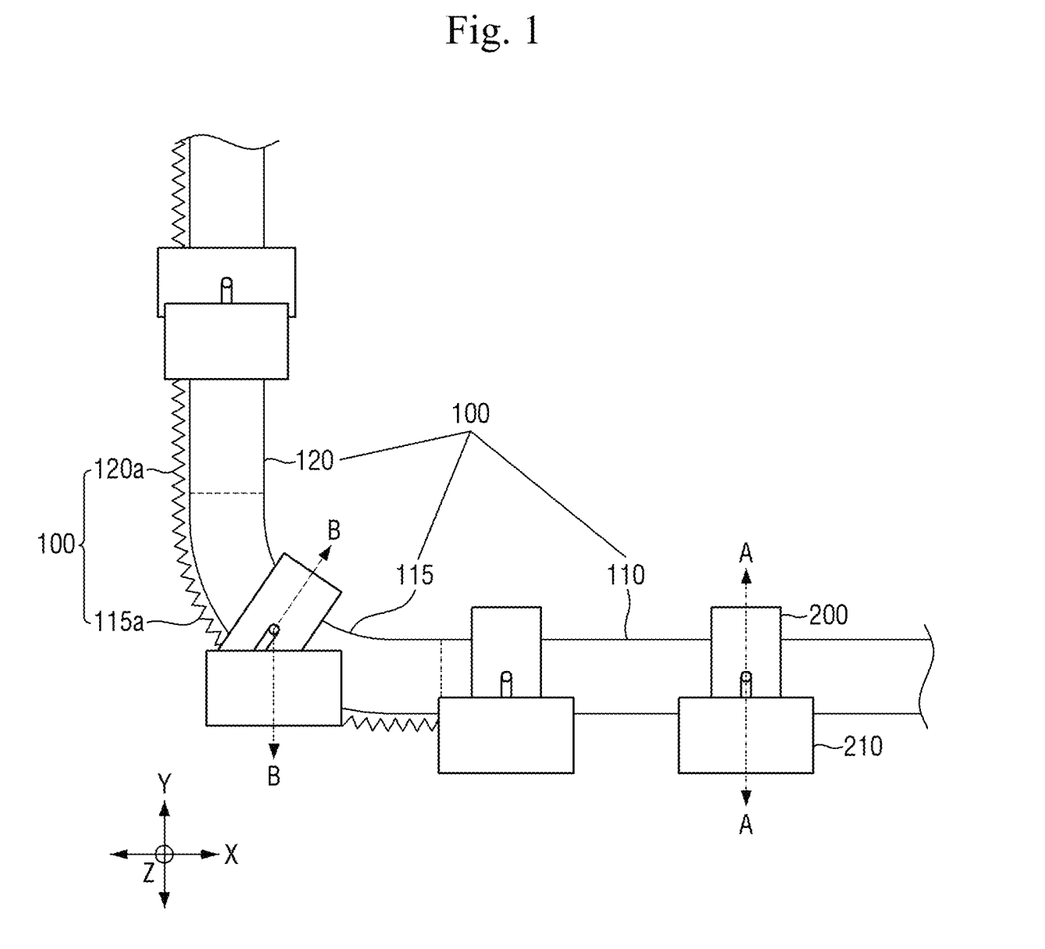
FIG. 1 is a conceptual diagram illustrating a transport system according to one embodiment of the present disclosure.
Figure 2:
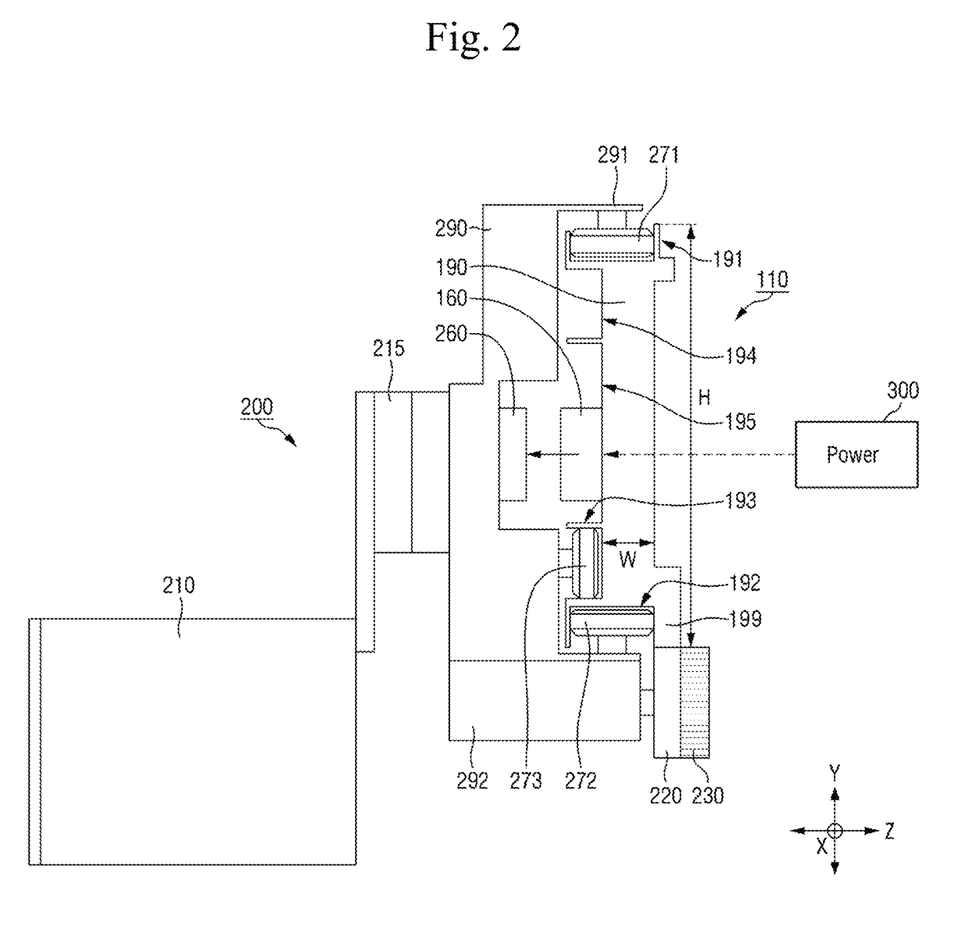
FIG. 2 is a sectional view taken along line A-A of FIG. 1.
Figure 3:
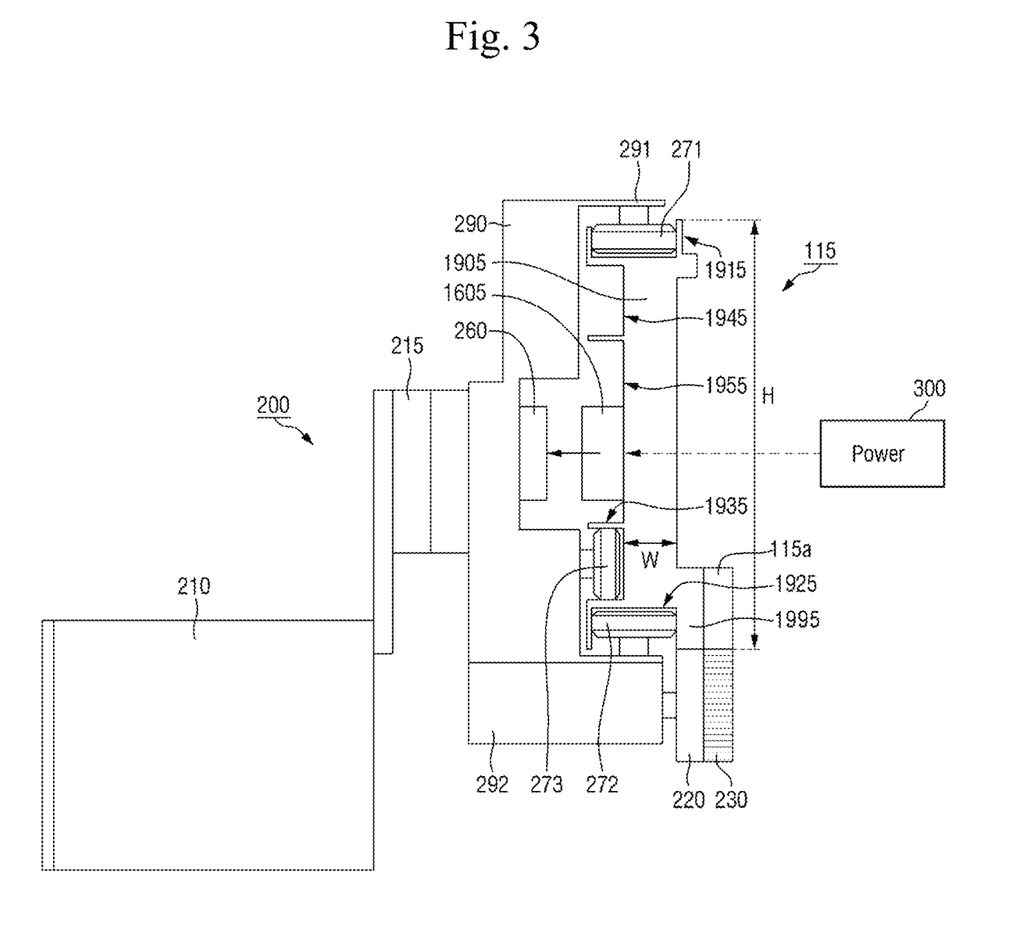
FIG. 3 is a sectional view taken along line B-B of FIG. 1.
Figure 4:
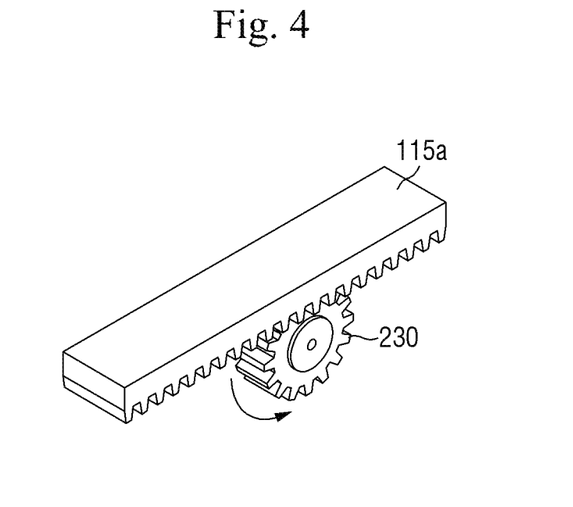
FIG. 4 is a view illustrating a relationship between a rack rail and a pinion gear illustrated in FIG. 3.
Figure 5:
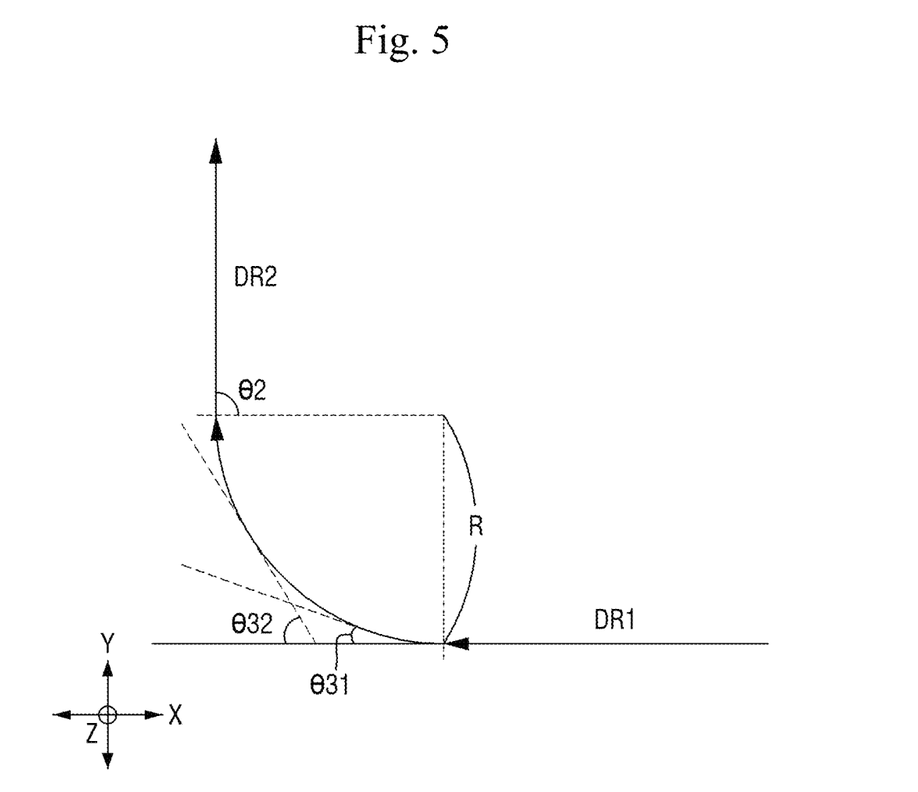
FIG. 5 is a view describing a first rail, a second rail, and a first connection rail of FIG. 1.

FIG. 1 is a conceptual diagram illustrating a transport system according to one embodiment of the present disclosure. FIG. 2 is a sectional view taken along line A-A of FIG. 1. FIG. 3 is a sectional view taken along line B-B of FIG. 1. FIG. 4 is a view illustrating a relationship between a rack rail and a pinion gear illustrated in FIG. 3. FIG. 5 is a view describing a first rail, a second rail and a first connection rail of FIG. 1.

First, referring to FIG. 1, a transport system according to one embodiment of the present disclosure includes a rail device 100 and a transport vehicle 200.

The rail device 100 includes a first rail 110, a first connection rail 115, a second rail 120, and rack rails 115a and 120a.

The first rail 110, the first connection rail 115, and the second rail 120 may be physically connected to each other.

As illustrated in FIGS. 1 and 5, the first rail 110 extends in a first direction DR1 (e.g., a x-direction). The first rail 110 has a first inclination angle $\theta 1$. As illustrated in FIG. 5, since the first inclination angle $\theta 1$ is 0° (i.e., when it is horizontal), $\theta 1$ is not illustrated.

The second rail 120 extends in a second direction DR2 (e.g., a y-direction). The second rail 120 has a second inclination angle $\theta 2$ larger than the first inclination angle $\theta 1$. Although FIG. 5 illustrates that the second inclination angle $\theta 2$ is 90° (i.e., when it is vertical), the present disclosure is not limited thereto.

In order to connect the first rail 110 to the second rail 120 having different inclination angles, inclination angles $\theta 31$ and $\theta 32$ of the first connection rail 115 may gradually increase from the first inclination angle $\theta 1$ to the second inclination angle $\theta 2$.

In other words, as the first connection rail 115 is a curved rail that bends towards the second rail 120, it may have, for example, a shape bent along a virtual arc having a radius R. As illustrated, the inclination angle of the first connection rail 115 in a first position may be $\theta 31$, while the inclination angle thereof in a second position may be $\theta 32$ larger than $\theta 31$.

Alternatively, the first connection rail 115 may have a shape where a plurality of short straight rails are connected. Each of the plurality of short straight rails may have different inclination angles. For instance, the first connection rail 115 may have a shape where the plurality of short straight rails with an inclination angle increasing by 5° are connected. In other words, the first connection rail 115 may be provided in the form where a short straight rail with an inclination angle of 5°, a short straight rail with an inclination angle of 10°, a short straight rail with an inclination angle of 15°, ..., and a short straight rail with an inclination angle of 85° may be sequentially connected.

Meanwhile, FIG. 1 illustrates that the first inclination angle $\theta 1$ of the first rail 110 is 0° and the second inclination angle $\theta 2$ of the second rail 120 is 90°, but the present disclosure is not limited thereto. For example, the first inclination angle $\theta 1$ of the first rail 110 may be 0° or more and less than 10°, and the second inclination angle $\theta 2$ of the second rail 120 may be 45° or more and 90° or less. For example, the first inclination angle $\theta 1$ of the first rail 110 may be 8°, and the second inclination angle $\theta 2$ of the second rail 120 may be 90°.

The first connection rail 115 is meant to connect the first rail 110 to the second rail 120 via a short section, and the length of the first connection rail 115 may be shorter than the length of the first rail 110.

Referring back to FIG. 1, the rack rails 115a and 120a may be installed along the first connection rail 115 and the second rail 120. The rack rails 115a and 120a are not installed on the first rail 110.

As the first inclination angle $\theta 1$ of the first rail 110 is considerably small (e.g., 0° or more and 10° or less), the transport vehicle 200 can move along the first rail 110 without difficulty. As a driving wheel 220 (see FIG. 2) of the transport vehicle 200 may rotate on the first rail 110, the transport vehicle 200 can move along the first rail 110.

However, since the second inclination angle $\theta 2$ of the second rail 120 is considerably large (e.g., 45° or more and 90° or less), the transport vehicle 200 cannot directly move up along the second rail 120. Accordingly, the rack rails 115a and 120a are installed on the first connection rail 115 and the second rail 120, and a pinion gear 230 (see FIG. 3) is installed in the transport vehicle 200. As the pinion gear 230 rotates and engages on the rack rails 115a and 120a, the transport vehicle 200 can move up along the second rail 120 with a high inclination angle.

Meanwhile, the transport vehicle 200 moves along a side surface of the first rail 110, a side surface of the first connection rail 115, and a side surface of the second rail 120.

A hand unit 210 configured to support the transported object is installed in a frame of the transport vehicle 200. As illustrated in FIG. 1, while the transport vehicle 200 moves along the first rail 110, the first connection rail 115, and the second rail 120, the hand unit 210 maintains horizontality by adjusts its position relative to the frame. In other words, the hand unit 210 faces downwards in the direction of gravity regardless of the position of the transport vehicle 200. Accordingly, by adjusting the hand unit 210, it is possible to prevent the transported object from deviating from the hand unit 210 even though it moves along the first connection rail 115 and the second rail 120 of the transport vehicle 200.

Herein, referring to FIG. 2, it will be described that the transport vehicle 200 moves along the first rail 110.

The transport vehicle 200 is disposed on the side surface (e.g., in a z-direction) of the first rail 110.

The transport vehicle 200 includes a frame 290, the hand unit 210, a cross roller bearing 215, a plurality of guide wheels 271, 272 and 273, the driving wheel 220, and the pinion gear 230.

The frame 290 includes an outer surface, an inner surface, an upper surface and a lower surface. When the driving direction of the transport vehicle 200 is the x-direction, the outer and inner surfaces of the frame 290 may be arranged in the z-direction, and the upper and lower surfaces of the frame 290 may be arranged in the y-direction.

The inner surface of the frame 290 faces the side surface (or a main surface) of the first rail 110.

The hand unit 210 is installed on the outer surface of the frame 290. The hand unit 210 serves to pick up and support the transported object, such as, for example, a container with a plurality of loaded substrates (e.g., a front opening universal pod (FOUP) and a front opening shipping box (FOSB)), but the present disclosure is not limited thereto.

The cross roller bearing 215 is disposed between the outer surface of the frame 290 and the hand unit 210. The cross roller bearing 215 is a compact bearing in which a plurality of rollers are arranged between an inner wheel and an outer wheel. The cross roller bearing 215 has a considerably small elastic displacement caused by the bearing load because a roller surface is in line contact, and can simultaneously receive complex loads such as a radial load, an axial load and a moment. As described above, the horizontality of the hand unit 210 is maintained by the operation of the cross roller bearing 215 while the transport vehicle 200 moves. In other words, the hand unit 210 faces downwards in the direction of gravity regardless of the position of the transport vehicle 200.

Meanwhile, a first subframe 291 is formed to protrude towards the rail device 110 on the upper surface of the frame 290. A first guide wheel 271 is installed on a bottom surface of the first subframe 291.

A second subframe 292 is formed to protrude towards the rail device 110 on the lower surface of the frame 290. Alternatively, a second guide wheel 272 is installed on an upper surface of the second subframe 292.

In addition, alternatively, a third guide wheel 273 may be installed on the inner surface of the frame 290.

The first guide wheel 271, the second guide wheel 272, and the third guide wheel 273 can adjust the position/interval between the transport vehicle 200 and the first rail 110, thus allowing the transport vehicle 200 to move along the first rail 110 in an accurate position.

In addition, the driving wheel 220 and the pinion gear 230 may be installed in the second subframe 292. As illustrated, the driving wheel 220 and the pinion gear 230 are fastened to each other, and the driving wheel 220 and the pinion gear 230 are driven by a motor. Accordingly, the number of rotations of the driving wheel 220 may be identical to the number of rotations of the pinion gear 230. In other words, as the pinion gear 230 rotates once, the driving wheel 220 also rotates once.

Meanwhile, the first rail 110 includes a rail body 190 extending long along the driving direction (i.e., the x-direction) of the transport vehicle 200.

The rail body 190 includes a main surface, a rear surface, an upper surface, and a lower surface. When the driving direction of the transport vehicle 200 is the x-direction, the main and rear surfaces of the rail body 190 may be arranged in the z-direction, and the upper and lower surfaces of the rail body 190 may be arranged in the y-direction.

Herein, a width W of the rail body 190 is smaller than a height H of the rail body 190. The width W of the rail body 190 means a distance between a main surface facing the frame 290 and a rear surface positioned opposite the main surface. The height H of the rail body 190 means a distance between the upper surface and the lower surface. As illustrated, the height H of the rail body 190 may be twice or more than the width W. A cross section (i.e., a cross section by the yz plane) of the rail body 190 is narrow in the main surface-rear surface direction (i.e., the z-direction) and long in the upper surface-lower surface direction (i.e., the y-direction). The hand unit 210 of the transport vehicle 200 is disposed at a main surface (i.e., a side surface) of the rail body 190.

The main surface of the rail body 190 faces the inner surface of the frame 290.

A first groove 191 is formed on the upper surface (e.g., one side in the y-direction) of the rail body 190, and a second groove 192 is formed on the lower surface thereof (e.g., the other side in the y-direction). In addition, a first driving surface 199 is installed on the lower surface of the rail body 190.

The first groove 191 of the rail body 190 supports and guides the first guide wheel 271 of the transport vehicle 200. The second groove 192 of the rail body 190 supports and guides the second guide wheel 272 of the transport vehicle 200.

The first driving surface 199 may be at least one of sidewalls defining the second groove 192. FIG. 2 illustrates that the first driving surface 199 is formed on a sidewall disposed on the right side among the sidewalls defining the second groove 192. Said differently, the second groove 192 may include a groove recessed from the first driving surface 199 to the rail body 190. The first driving surface 199 is in direct contact with the driving wheel 220 of the transport vehicle 200. The driving wheel 220 rotates along the first driving surface 199 to move the transport vehicle 200 in the driving direction (i.e., the x-direction).

Furthermore, a third groove 193 and a fourth groove 194 spaced apart from each other may be installed on the main surface of the rail body 190. The third groove 193 and the fourth groove 194 are meant to support and guide the third guide wheel 273 of the transport vehicle 200. For instance, on a lower layer (e.g., a first layer), the third guide wheel 273 moves along the third groove 193 disposed at the bottom of the main surface; however, after the transport vehicle 200 moves along the second rail 120 to an upper layer (e.g., a third floor), the third guide wheel 273 moves along the fourth groove 194 disposed at the top of the main surface (see FIG. 6).

In addition, a space 195 is present between the third groove 193 and the fourth groove 194 on the main surface of the rail body 190. A power cable 160 that supplies power from an external power supply unit 300 is positioned in the space 195. A pickup unit 260 is installed on an inner surface of the transport vehicle 200, and the pickup unit 260 receives power from the power cable 160 wirelessly. The motor (not shown) drives the driving wheel 220 and the pinion gear 230 using the received power Herein, referring to FIG. 3, it will be described that the transport vehicle 200 moves along the first connection rail 115.

Since the transport vehicle 200 continuously moves from the first rail 110 to the first connection rail 115, the cross section of the first rail 110 described in FIG. 2 is substantially identical to the cross section of the first connection rail 115 described in FIG. 3.

A rail body 1905 of the first connection rail 115 is connected to the rail body 190 of the first rail 110. A plurality of grooves 1915, 1925, 1935, 1945 and 1955 of the first connection rail 115 are connected to a plurality of grooves 191, 192, 193, 194 and 195 of the first rail 110. A power cable 1605 of the first connection rail 115 is also connected to the power cable 160 of the first rail 110.

However, the rack rail 115a is not installed in the first rail 110, but is installed along the first connection rail 115. Since the driving wheel 220 and the pinion gear 230 of the transport vehicle 200 are fastened to each other, the rack rail 115a is installed in parallel with a driving surface 1995. The pinion gear 230 rotates on the rack rail 115a, and the driving wheel 220 rotates on the driving surface 1995.

By fastening the pinion gear 230 to the rack rail 115a, the transport vehicle 200 may stably move up along the first connection rail 115.

As described above, the driving wheel 220 and the pinion gear 230 may be driven by a motor (not shown). Such a motor may be a brake motor. Since the brake motor has a brake installed therein, even if the power supply stops while the transport vehicle 200 moves up along the first connection rail 115 or the second rail 120, the transport vehicle 200 does not fall off the first connection rail 115 or the second rail 120. In other words, safety-related accidents can be avoided.

Although a separate cross-section view is not illustrated, a cross section of the first connection rail 115 is identical to that of the second rail 120.

Referring back to FIG. 1, the transport vehicle 200 may move up along the first connection rail 115 and the second rail 120 that are continuous with the first rail 110 without using a lift tower. This is because the transport vehicle 200 includes not only the driving wheel 220 but also the pinion gear 230 and the pinion gear 230 is fastened to the rack rails 115a and 120a installed along the first connection rail 115 and the second rail 120. Accordingly, unlike the tower lifter, since the transport time of the transported object or the waiting time is not consumed, the movement between layers of the transported object is quickly and smoothly performed.

Figure 6:
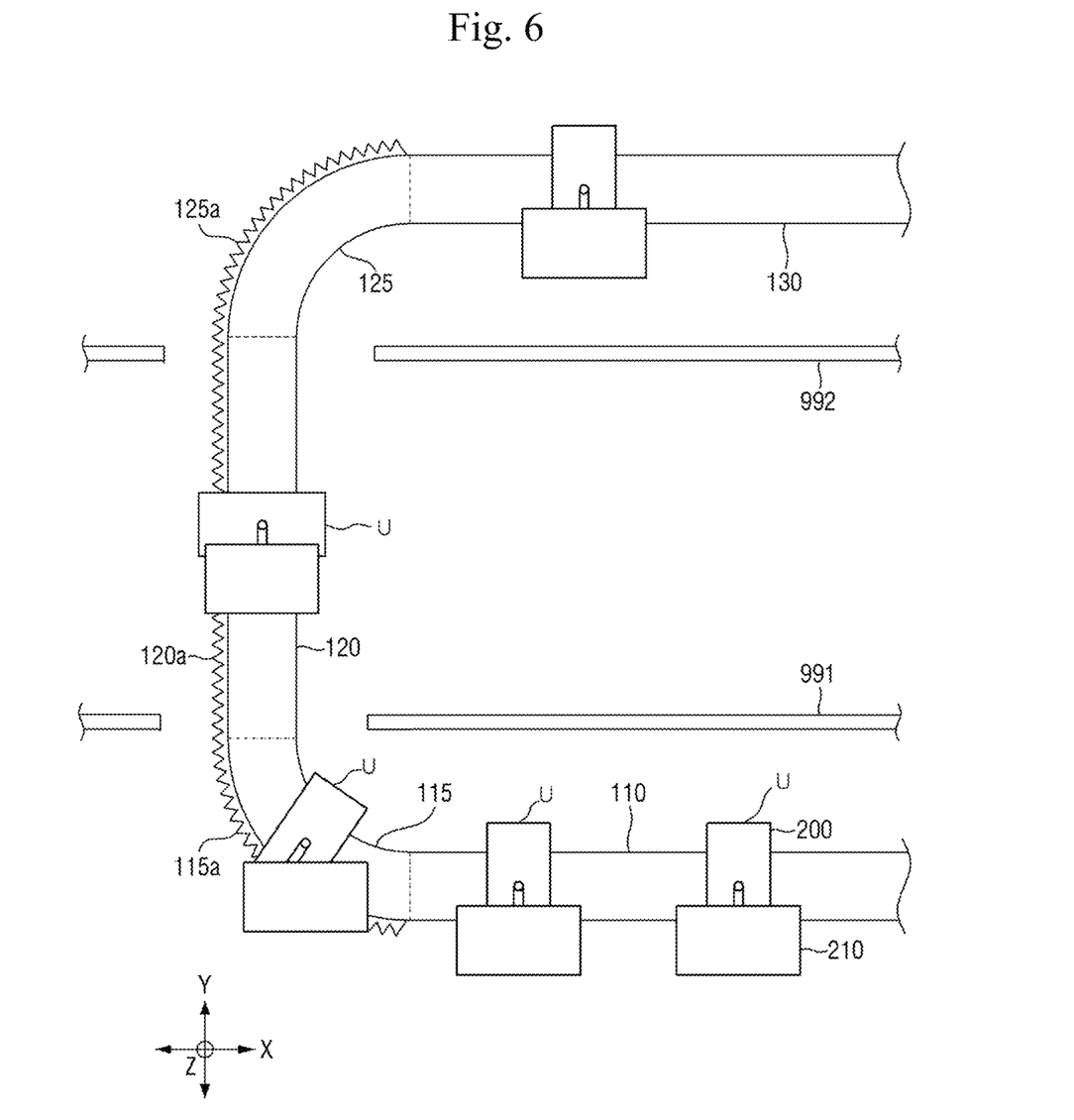
FIG. 6 is a conceptual diagram describing the transport system according to another embodiment of the present disclosure.

FIG. 6 is a conceptual diagram describing the transport system according to another embodiment of the present disclosure. For convenience of description, the differences from the content described with reference to FIGS. 1 to 5 will be mainly described.

Referring to FIG. 6, the rail device 100 includes the first rail 110, the first connection rail 115, the second rail 120, a second connection rail 125, a third rail 130, and the rack rails 115a, 120a, and 125a.

An interlayer wall 991 is installed between the lower layer (e.g., the first layer) and an intermediate layer (e.g., a second layer), and an interlayer wall 992 is installed between the intermediate layer and the upper layer (e.g., the third layer).

The first rail 110 is installed on the lower layer, and the third rail 130 is installed on the upper layer. The first rail 110 is connected to the third rail 130 via the first connection rail 115, the second rail 120, and the second connection rail 125.

The first rail 110 has a first inclination angle (e.g., 0°), and the second rail 120 has a second inclination angle (e.g., 90°) lager than the first inclination angle. The first connection rail 115 connects the first rail 110 to the second rail 120, and an inclination angle of the first connection rail 115 gradually increases from the first inclination angle to the second inclination angle. The third rail 130 has a third inclination angle (e.g., 0°) less than the second inclination angle, and an inclination angle of the second connection rail 125 gradually decreases from the second inclination angle to the third inclination angle.

For example, the first inclination angle θ1 of the first rail 110 may be 0° or more and less than 10°, the second inclination angle θ2 of the second rail 120 may be 45° or more and 90° or less, and the third inclination angle of the third rail 130 may be 0° or more and less than 10°.

Similarly to the first connection rail 115, the second connection rail 125 may have a shape bent along a virtual arc having a radius R. Alternatively, the second connection rail 125 may have a shape where a plurality of short straight rails are connected, and each of the plurality of short straight rails may have different inclination angles.

The first connection rail 115 is meant to connect the first rail 110 to the second rail 120 via the short section, and the length of the first connection rail 115 may be shorter than that of the first rail 110. Likewise, the second connection rail 125 is meant to connect the second rail 120 to the third rail 130 via the short section, and the length of the second connection rail 125 may be shorter than that of the third rail 130.

The transport vehicle 200 moves along the side surface of the first rail 110, the side surface of the first connection rail 115, the side surface of the second rail 120, the side surface of the second connection rail 125, and the side surface of the third rail 130.

In addition, the rack rails 115a, 120a and 125a may be installed along the first connection rail 115, the second rail 120, and the second connection rail 125. The rack rails 115a and 120a are not installed on the first rail 110 and the third rail 130. Accordingly, when the transport vehicle 200 moves from the lower layer to the upper layer, the pinion gear of the transport vehicle 200 is fastened to the rack rails 115a, 120a and 125a.

Meanwhile, when the transport vehicle 200 moves along the first rail 110, an upper surface U faces the interlayer wall 991. When the transport vehicle 200 moves along the first connection rail 115, the upper surface U begins to laterally incline. When the transport vehicle 200 moves along the second rail 120, the upper surface U is completely inclined to the right. When the transport vehicle 200 moves along the third rail 130, the upper surface U faces the interlayer wall 992. In other words, the direction of the frame 290 of the transport vehicle 200 in the lower layer (e.g., the first layer) is opposite to the direction of the frame 290 of the transport vehicle 200 in the upper layer (e.g., the third layer) (i.e., up and down reversal). Even if the direction of the frame 290 moves as described above, the hand unit 210 maintains horizontality. In other words, the hand unit 210 faces downwards in the direction of gravity.

Figure 7:
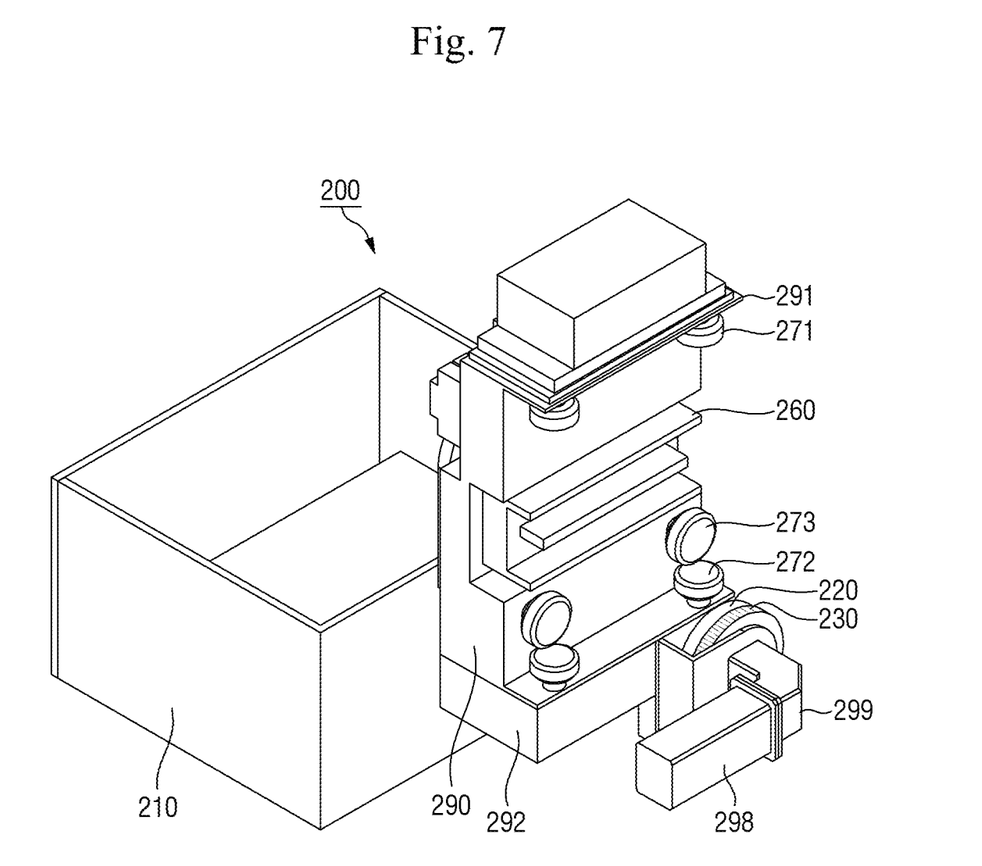
FIGS. 7 to 9 are views describing a transport vehicle used in some embodiments of the present disclosure.
Figure 8:
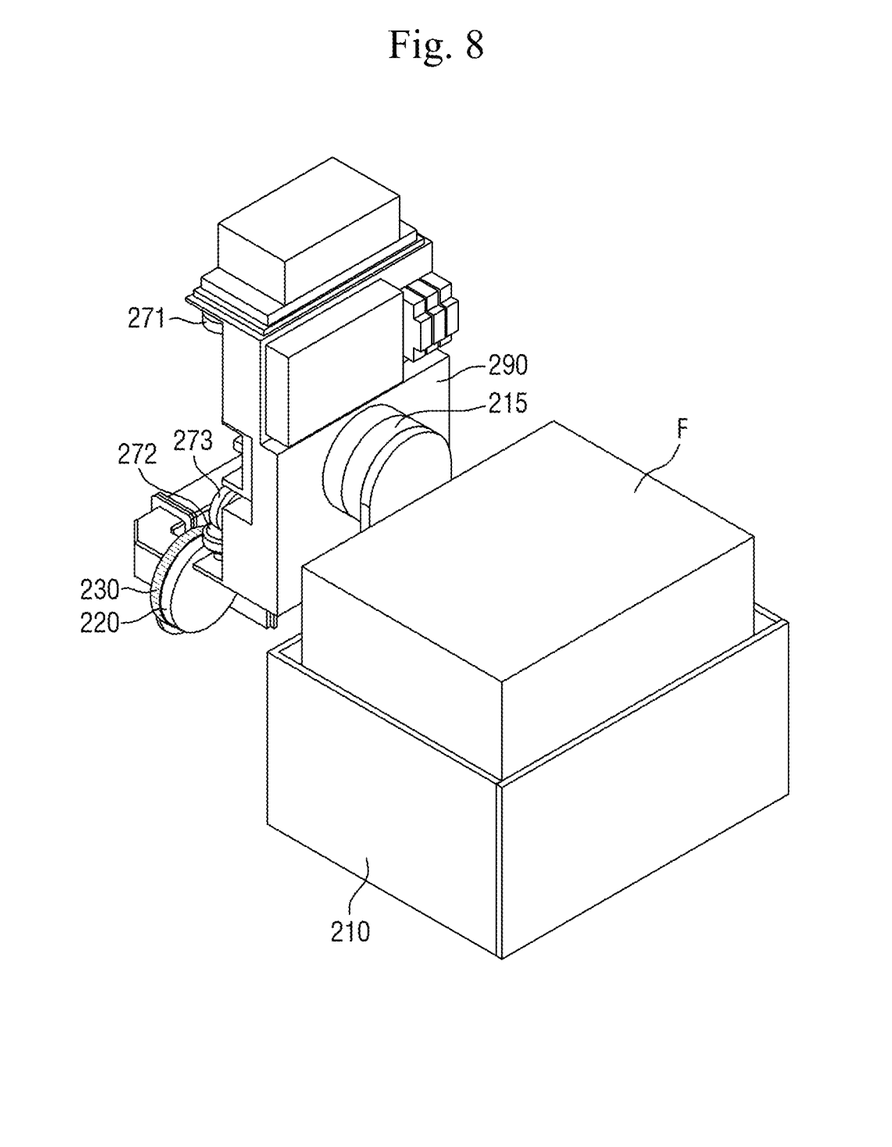
Figure 9:
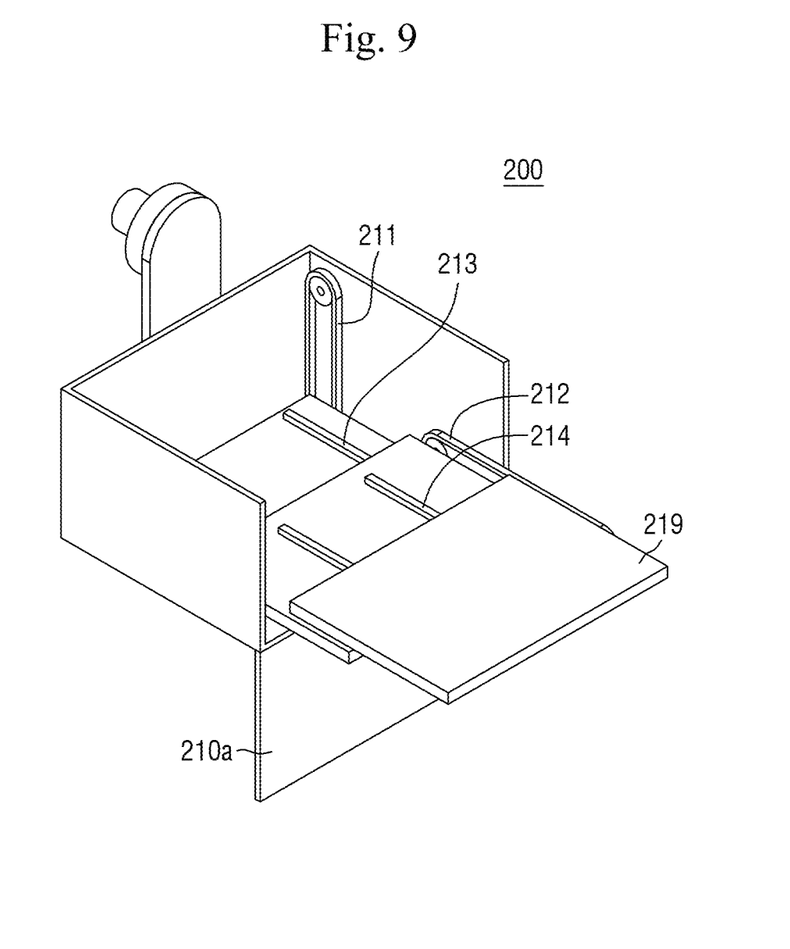

FIGS. 7 to 9 are views describing the transport vehicle used in some embodiments of the present disclosure. This is an example of specifically implementing the transport vehicle described in FIG. 2. FIG. 7 is a perspective view illustrating the inner side of the frame of the transport vehicle, FIG. 8 is a perspective view illustrating the direction in which the outer side of the frame of the transport vehicle is seen, and FIG. 9 is a view describing the operation of the hand unit of the transport vehicle.

First, referring to FIG. 7, the inner surface of the frame 290 faces the side surface (or the main surface) of the first rail 110.

The first subframe 291 is formed to protrude towards the rail device on the upper surface of the frame 290. The first guide wheel 271 is installed on the bottom surface of the first subframe 291. Although it is illustrated that two first guide wheels 271 are installed along the driving direction of the transport vehicle 200, the present disclosure is not limited thereto.

The second subframe 292 is formed to protrude towards the rail device on the lower surface of the frame 290. Alternatively, the second guide wheel 272 is installed on the upper surface of the second subframe 292. Although it is illustrated that two second guide wheels 272 are installed along the driving direction of the transport vehicle 200, the present disclosure is not limited thereto.

The third guide wheel 273 may be installed on the inner surface of the frame 290. Although it is illustrated that two third guide wheels 273 are installed along the driving direction of the transport vehicle 200, the present disclosure is not limited thereto.

The driving wheel 220 and the pinion gear 230 are installed in the second subframe 292. The driving wheel 220 and the pinion gear 230 are driven by a motor 298. The motor 298 transmits a driving force to the driving wheel 220 and the pinion gear 230 via a reducer 299.

In addition, the pickup unit 260 is installed on the inner side of the frame 290, and the pickup unit 260 receives power wirelessly from a power cable installed on the rail Referring to FIG. 8, the hand unit 210 is installed on the outer surface of the frame 290. The hand unit 210 serves to pick up and support the transported object F. A cross roller bearing 215 is disposed between the outer surface of the frame 290 and the hand unit 210.

Referring to FIG. 9, the hand unit 210 includes a plurality of plates 219, belts 211 and 212, and guides 213 and 214.

The plurality of plates 219 may be disposed in multiple layers and may support and pick up the transported object F. When a front cover 210a of the hand unit 210 is opened, the belts 211 and 212 and the guides 213 and 214 allow the plurality of plates 219 to move up and down or move forward/backward. When the plate 219 moves forward to pick up the transported object F and moves backwards to return its original position, the front cover 210a is closed again.

Figure 10:
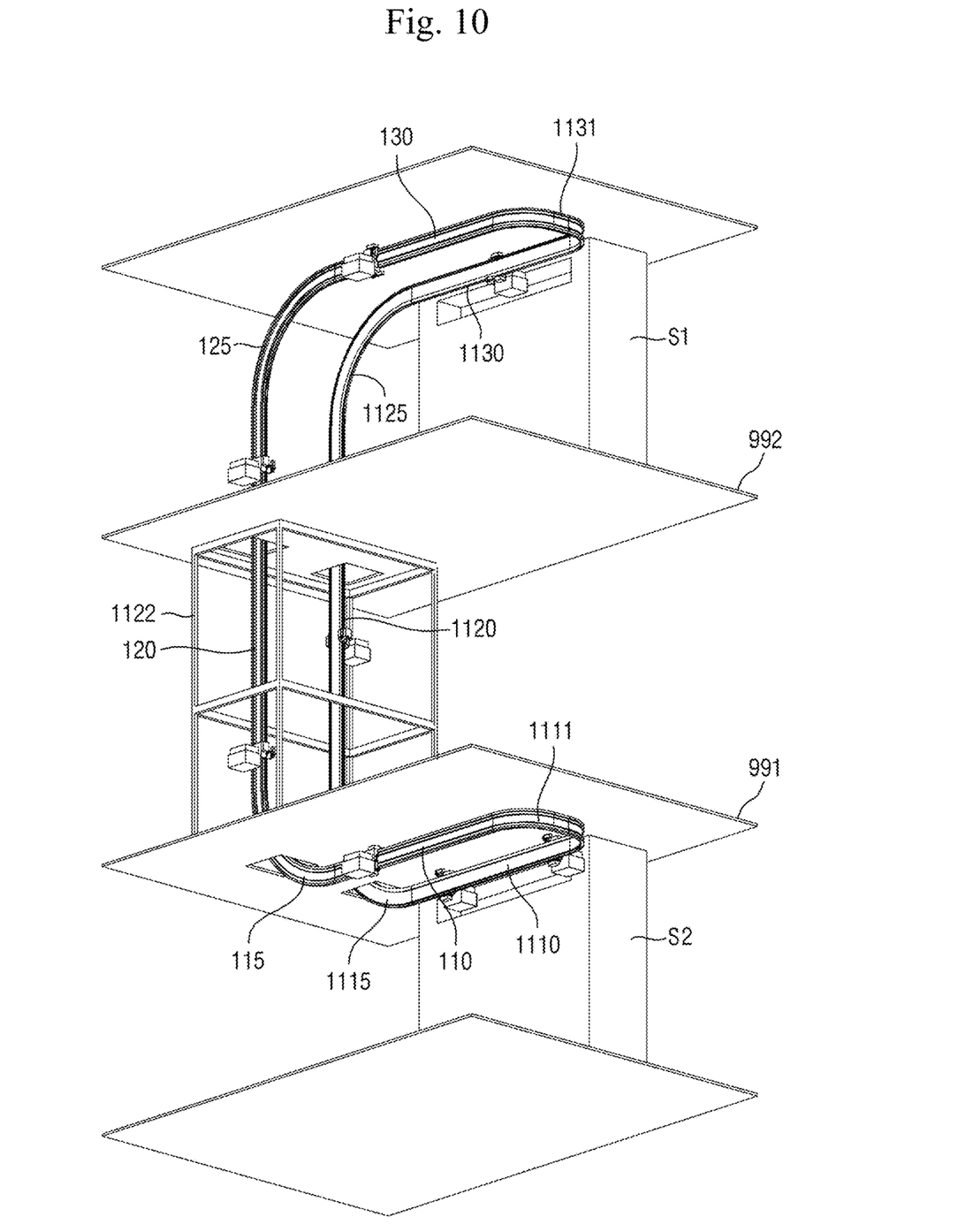
FIGS. 10 and 11 are perspective views illustrating the transport system according to another embodiment of the present disclosure.
Figure 11:
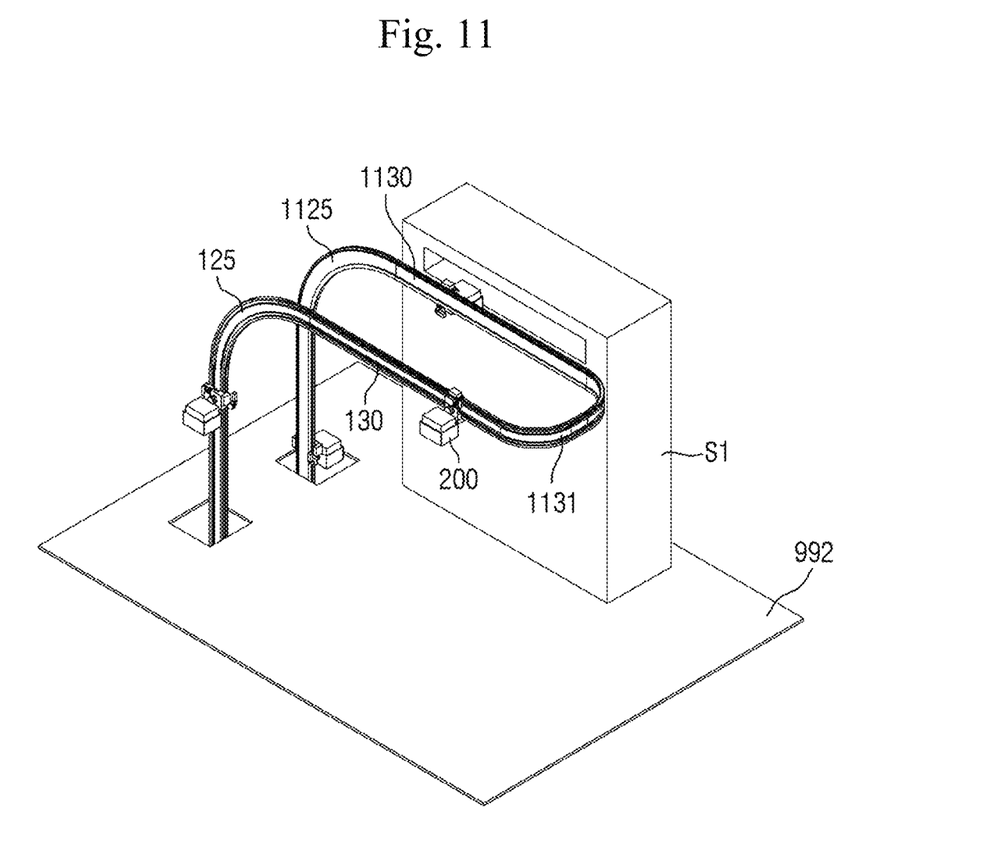

FIGS. 10 and 11 are perspective views illustrating the transport system according to another embodiment of the present disclosure. FIG. 10 is an example of specifically implementing the transport system described using FIG. 6. FIG. 11 is an enlarged view of the transport system installed on the upper layer of FIG. 10.

Referring to FIGS. 10 and 11, the interlayer wall 991 is installed between the lower layer (e.g., the first layer) and the intermediate layer (e.g., the second layer), and the interlayer wall 992 is installed between the intermediate layer and the upper layer (e.g., the third layer).

FIGS. 10 and 11 illustrate a circulation-type rail device for the transport vehicle 200 to reciprocate between the lower layer and the upper layer. The rail device includes the first rail 110, the first connection rail 115, the second rail 120, the second connection rail 125, a third rail 130, a third connection rail 1131, a fourth rail 1130, a fourth connection rail 1125, a fifth rail 1120, a fifth connection rail 1115, a sixth rail 1110, a sixth connection rail 1111, and a rack rail. The rack rail is installed on the first connection rail 115, the second rail 120, the second connection rail 125, the fourth connection rail 1125, the fifth rail 1120, and the fifth connection rail 1115.

Specifically, the transport vehicle 200 moves along the first rail 110, the first connection rail 115, the second rail 120, the second connection rail 125, and the third rail 130 on the lower floor, and penetrates the immediate layer, thus reaching the upper layer.

On the upper layer, the transport vehicle 200 reaches the fourth rail 1130 through the third connection rail 1131 from the third rail 130. The third connection rail 1131 is connected to the third rail 130 and disposed on the same plane as the third rail 130, and has a U shape. The transport vehicle 200 can make a U-turn through the third connection rail 1131. The transport vehicle 200 moves along a side surface of the third rail 130, a side surface of the third connection rail 1131, and a side surface of the fourth rail 1130.

The hand unit 210 transmits the transmitted object to a stocker S1 on the fourth rail 1130.

The transport vehicle 200 moves along the fourth connection rail 1125, the fifth rail 1120, the fifth connection rail 1115 and the sixth rail 1110 on the upper layer, and penetrates the immediate layer, thus reaching the lower layer.

On the lower layer, the transport vehicle 200 allows the hand unit 210 to pick up the transported object from a stocker S2 on the sixth rail 1110.

The transport vehicle 200 reaches the first rail 110 through the sixth connection rail 1111 from the sixth rail 1110. The sixth connection rail 1111 is connected to the first rail 110 and the sixth rail 1110 and disposed on the same plane as the first rail 110 and the sixth rail 1110 and has the U shape. The transport vehicle 200 may make the U-turn through the sixth connection rail 1111. The transport vehicle 200 moves along the side surface of the sixth rail 1110, the side surface of the sixth connection rail 1111 and the side surface of the first rail 110.

Meanwhile, on the intermediate layer, a protection plate 1122 surrounds the second rail 120 and the fifth rail 1120 to protect the second rail 120 and the fifth rail 1120 corresponding to vertical rails.

Furthermore, although, as described above, the transported object is picked up from the stocker S2 on the lower layer and is transmitted to the stocker S1 on the upper layer, the present disclosure is not limited thereto. In other words, the transported object may be picked up from the stocker S1 on the upper layer, and the transported object may be transmitted to the stocker S2 on the lower layer.

Although the embodiments of the present disclosure have been described above with reference to the accompanying drawings, the present disclosure is not limited to the disclosed embodiments, but may be implemented in various different ways, and the present disclosure may be embodied in many different forms without changing technical subject matters and essential features as will be understood by those skilled in the art. Therefore, embodiments set forth herein are exemplary only and not to be construed as a limitation.

What is claimed is:

1. A transfer system, comprising:
   a rail device; and
   a transport vehicle moving in the rail device,
   wherein the rail device comprises:
   a first rail with a first inclination angle;
   a second rail with a second inclination angle larger than the first inclination angle;
   a first connection rail configured to connect the first rail to the second rail; and a rack rail installed along the first connection rail and the second rail, wherein the transport vehicle comprises:
a frame;
a driving wheel connected to the frame and moving the first rail, the first connection rail and the second rail; and
a pinion gear connected to the frame and moving along the rack rail,
wherein the first rail comprises:
a first rail body extending long along the driving direction;
a first groove installed on an outer upper surface of the first rail body and configured to support a first guide wheel of the transport vehicle; and
a first driving surface installed on an outer lower surface of the first rail body and in direct contact with the driving wheel, and
wherein the first rail body is disposed between the first guide wheel and the driving wheel.

2. The transfer system of claim 1, wherein the driving wheel and the pinion gear are fastened to each other and are driven by a motor.

3. The transfer system of claim 1, wherein the transport vehicle moves along a side surface of the first rail, a side surface of the first connection rail, and a side surface of the second rail.

4. The transfer system of claim 1, wherein the width of the first rail body is smaller than the height of the first rail body,
wherein the width of the first rail body is a distance between a main surface facing the frame and a rear surface positioned opposite the main surface, and
the height of the first rail body is a distance between the upper surface and the lower surface.

5. The transfer system of claim 1, wherein the rail body comprises:
a second groove installed on a lower surface of the first rail body and configured to support a second guide wheel of the transport vehicle; and
a third groove installed in a main surface of the first rail body and configured to support a third guide wheel of the transport vehicle.

6. The transfer system of claim 5, wherein the second groove includes a groove recessed from the first driving surface towards the first rail body.

7. The transfer system of claim 1, wherein the first connection rail comprises:
a second rail body extending long along the driving direction;
a fourth groove installed on the upper surface of the second rail body and configured to support the first guide wheel of the transport vehicle; and
a second driving surface installed on a lower surface of the second rail body and in direct contact with the driving wheel,
wherein the rack rail is installed in parallel with the second driving surface.

8. The transfer system of claim 1, wherein a power cable configured to supply power is installed on the main surface of the first rail body, and
a pickup unit configured to wirelessly receive power supplied from the power cable is installed on an inner surface of the frame.

9. The transfer system of claim 1, wherein the rack rail is not installed on the first rail.

10. The transfer system of claim 1, further comprising:
a third rail with a third inclination angle less than the second inclination angle; and
a second connection rail configured to connect the second rail to the third rail,
wherein the rack rail is further installed along the second connection rail and is not installed on the third rail.

11. The transfer system of claim 1, wherein the transport vehicle further comprises a hand unit installed on the frame and configured to support the transported object, and
while the transport vehicle moves along the first rail, the first connection rail, and the second rail, the hand unit maintains horizontality by adjusts its position relative to the frame.

12. The transfer system of claim 11, wherein a cross roller bearing is disposed between the frame and the hand unit, and the hand unit is maintained horizontally by an operation of the cross roller bearing.

13. The transfer system of claim 1, wherein the first rail is a rail for moving the transport vehicle in the horizontal direction, and the second rail is a rail for moving the transport vehicle in the vertical direction.

14. The transfer system of claim 13, wherein the first connection rail is bent along a virtual arc.

15. A transfer system, comprising:
a rail device comprising: a first rail extending horizontally, a first connection rail connected to the first rail and configured to increase an inclination angle thereof; a second rail connected to the first rail and extending vertically; a second connection rail connected to the second rail and configured to decrease an inclination angle thereof; and a third rail connected to the second connection rail and extending horizontally; and
a transport vehicle moving along a side surface of the first rail, a side surface of the first connection rail, a side surface of the second rail, a side surface of the second connection rail, and a side surface of the third rail,
wherein the rail device further comprises a rack rail installed on the first connection rail, the second rail and the second connection rail, and not installed on the first rail and the third rail, and
the transport vehicle comprises a driving wheel and a pinion gear,
wherein when the transport vehicle moves on the first rail, the driving wheel is used,
when the transport vehicle moves up along the first connection rail, the second rail and the second connection rail, the driving wheel and the pinion gear are used, and
when the transport vehicle moves on the third rail, the driving wheel is used.

16. The transfer system of claim 15, wherein the driving wheel and the pinion gear are fastened to each other and are driven by a motor.

17. The transfer system of claim 15, wherein the transport vehicle comprises:
a frame in which the driving wheel and the pinion gear are installed; and
a hand unit installed on the frame and configured to support the transported object,
wherein, while the transport vehicle moves along the first rail, the first connection rail, the second rail, the second connection rail and the third rail, the hand unit maintains horizontality by adjusts its position relative to the frame.

18. The transfer system of claim 15, wherein the rail device comprises:
- a third connection rail connected to the third rail, disposed on the same plane as the third rail and having a U-shaped third connection rail; and
- a fourth rail connected to the third connection rail and extending horizontally,
- wherein the transport vehicle moves along a side surface of the third rail, a side surface of the third connection rail, and a side surface of the fourth rail.

19. A transport vehicle, comprising:
- a frame including an outer surface, an inner surface, an upper surface and a lower surface;
- a hand unit installed on the outer surface of the frame and configured to support the transported object;
- a cross roller bearing connected to the hand unit and configured to maintain the horizontality of the hand unit;
- a pickup unit installed on the inner surface of the frame and configured to receive power from the rail device;
- a first subframe protruding towards the rail device on the upper surface of the frame;
- a first guide wheel installed on an outer lower surface of the first subframe;
- a second subframe protruding towards the rail device on the lower surface of the frame;
- a second guide wheel installed on an upper surface of the second subframe; and
- a driving wheel and a pinion gear installed in the second subframe,
- wherein the rail device is disposed between the first guide wheel and the driving wheel.

* * * * *